United States Patent
Iwasa

(10) Patent No.: US 9,634,663 B2
(45) Date of Patent: Apr. 25, 2017

(54) SEMICONDUCTOR CIRCUIT, SEMICONDUCTOR DEVICE AND POTENTIAL SUPPLY CIRCUIT

(71) Applicant: LAPIS SEMICONDUCTOR CO., LTD., Kanagawa (JP)

(72) Inventor: Yosuke Iwasa, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/665,339

(22) Filed: Mar. 23, 2015

(65) Prior Publication Data
US 2015/0280711 A1    Oct. 1, 2015

(30) Foreign Application Priority Data

Mar. 28, 2014 (JP) ................................. 2014-069848

(51) Int. Cl.
| | |
|---|---|
| H03L 5/00 | (2006.01) |
| H03K 19/003 | (2006.01) |
| H03K 19/00 | (2006.01) |
| H03K 19/0185 | (2006.01) |

(52) U.S. Cl.
CPC ... H03K 19/00315 (2013.01); H03K 19/0016 (2013.01); H03K 19/0185 (2013.01)

(58) Field of Classification Search
None
See application file for complete search history.

(56) References Cited

U.S. PATENT DOCUMENTS

| | | | | |
|---|---|---|---|---|
| 7,414,453 B2* | 8/2008 | Tachibana | ........ | H03K 3/356113 326/68 |
| 7,521,988 B2* | 4/2009 | Shin | ........ | G11C 5/145 327/536 |
| 2001/0010480 A1* | 8/2001 | Kato | ........ | G05F 1/465 327/546 |
| 2012/0313686 A1* | 12/2012 | Kikuchi | ........ | H03K 19/018521 327/333 |

FOREIGN PATENT DOCUMENTS

| | | |
|---|---|---|
| JP | 2004072434 | 3/2004 |
| JP | 2009010802 | 1/2009 |

* cited by examiner

*Primary Examiner* — Long Nguyen
(74) *Attorney, Agent, or Firm* — Volentine & Whitt, PLLC

(57) ABSTRACT

A semiconductor circuit including a level shifter circuit that, in accordance with supply of a power supply voltage, converts a potential of an input signal from a first potential to a second potential that is higher than the first potential and outputs the second potential through an output node; a potential supply circuit, to which a reset signal at a level in accordance with the power supply voltage is supplied, that supplies a predetermined potential in accordance with the level of the reset signal; and a control circuit that controls the potential of the output node of the level shifter circuit in accordance with the level of the predetermined potential supplied from the potential supply circuit.

9 Claims, 7 Drawing Sheets

SEMICONDUCTOR CIRCUIT, SEMICONDUCTOR DEVICE AND POTENTIAL SUPPLY CIRCUIT

CROSS-REFERENCE TO RELATED APPLICATION

This application claims priority under 35 USC 119 from Japanese Patent Application No. 2014-069848, filed on Mar. 28, 2014, the disclosure of which is incorporated by reference herein.

BACKGROUND OF THE INVENTION

Field of the Invention

The present invention relates to a semiconductor circuit, a semiconductor device and a potential supply circuit.

Description of the Related Art

A level shifter circuit that converts the potential of an input signal to a higher potential and outputs a converted signal is commonly known.

In the level shifter circuit, the output may become unstable when a power supply is turned ON or the like. When the output is in an unstable state, there may be an increase in current consumption, defects with start-up or the like. Accordingly, technologies for avoiding unstable states of output are known.

For example, Japanese Patent Application Laid-Open (JP-A) No. 2004-72434 discloses a technology providing a reset circuit that fixes the potential of a node at which an output signal of a level shifter is outputted, from when a power supply is turned ON until the power supply voltage exceeds a predetermined value. Further, for example, JP-A No. 2009-10802 discloses a technology that, when a power supply with a higher voltage than a constant-voltage power supply is turned ON, prevents irregular operation when the power supply is turned ON by setting the voltage state of an input signal to an input transistor of a level shifter.

With the above technologies, instability in the output of a level shifter circuit when a power supply is turned ON or the like may be prevented. However, leakage currents may occur.

SUMMARY OF THE INVENTION

The present invention provides a semiconductor circuit, a semiconductor device and a potential supply circuit that may both prevent an output of a level shifter entering an unstable state and block leakage currents.

A first aspect of the present invention is a semiconductor circuit including: a level shifter circuit that, in accordance with supply of a power supply voltage, converts a potential of an input signal from a first potential to a second potential that is higher than the first potential and outputs the second potential through an output node; a potential supply circuit, to which a reset signal at a level in accordance with the power supply voltage is supplied, that supplies a predetermined potential in accordance with the level of the reset signal; and a control circuit that controls the potential of the output node of the level shifter circuit in accordance with the level of the predetermined potential supplied from the potential supply circuit.

A second aspect of the present invention is a semiconductor device including: a semiconductor circuit according to the first aspect the present invention; a load circuit to which the output signal outputted through the output node of the level shifter circuit of the semiconductor circuit is supplied; and a power-ON reset circuit that supplies the reset signal in accordance with a power supply voltage.

A third aspect of the present invention is a potential supply circuit to which a reset signal at a level in accordance with a power supply voltage of a level shifter circuit is supplied, the potential supply circuit supplying a predetermined potential on the basis of the reset signal.

According to the above-described aspects of the present invention, a semiconductor circuit, a semiconductor device and a potential supply circuit that may both prevent an output of a level shifter entering an unstable state and block leakage currents, may be provided.

BRIEF DESCRIPTION OF THE DRAWINGS

Exemplary embodiments of the present invention will be described in detail based on the following figures, wherein.

DETAILED DESCRIPTION OF THE INVENTION

First Exemplary Embodiment

Herebelow, a present exemplary embodiment is described in detail, referring to the attached drawings.

Figure 1:
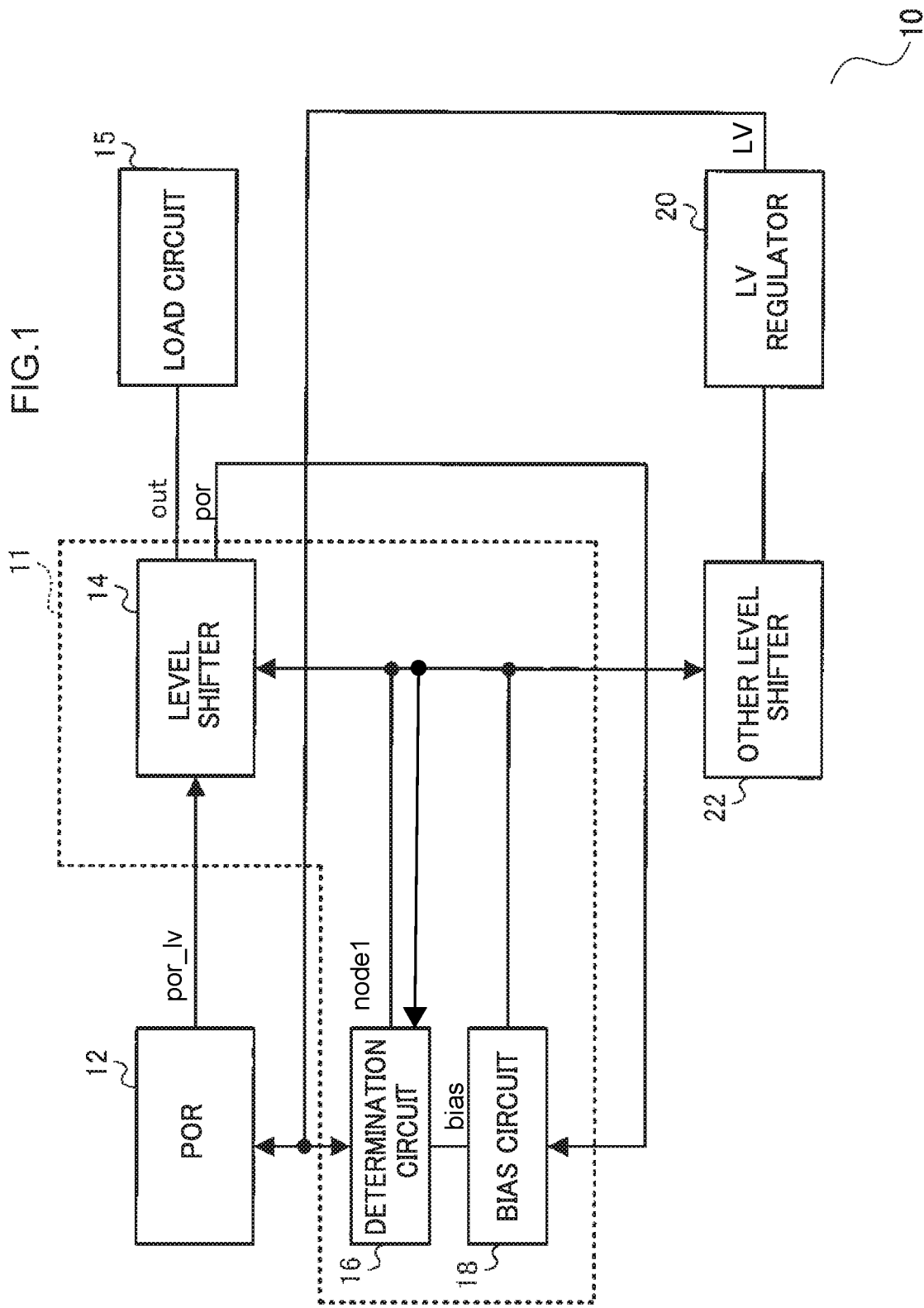
FIG. 1 is a schematic configurational diagram illustrating schematics of a semiconductor device in accordance with a first exemplary embodiment.

First, the configuration of a semiconductor device in accordance with the present exemplary embodiment is described. FIG. 1 illustrates a schematic configurational diagram of an example of the semiconductor device according to the present exemplary embodiment. As illustrated in FIG. 1, a semiconductor device 10 according to the present exemplary embodiment includes a POR (power-ON reset circuit) 12, a semiconductor circuit 11, a load circuit 15, an LV (low voltage) regulator 20 and an other level shifter 22.

The POR 12 according to the present exemplary embodiment is a circuit that senses the potential of a power supply voltage (power supply voltage LV) that is supplied to an LV power supply line 81 (see FIG. 2; described in detail below). The POR 12 performs a reset when the power supply voltage LV goes below a predetermined potential, and outputs a signal por_lv to a level shifter 14. In a power-ON reset state, the POR 12 supplies a reset signal por at the low level (in the present exemplary embodiment, 0 V) and, in a power-ON reset-released state, the POR 12 supplies the reset signal por at the high level (in the present exemplary embodiment, the potential of a power supply voltage HV). The reset signal por is supplied to the level shifter 14, a determination circuit 16 and a bias circuit 18.

In the present exemplary embodiment, a low potential is referred to by "LV" and a high potential that is higher than LV is referred to by "HV". Examples of LV that can be mentioned are from 1 V to 1.5 V, corresponding to the voltage of a single battery. Examples of HV that can be mentioned are from about twice LV to 5 V.

The semiconductor circuit 11 includes the level shifter 14, the determination circuit 16 and the bias circuit 18.

The bias circuit 18 generates a bias voltage in accordance with the reset signal por supplied from the POR 12 and supplies the bias voltage to the determination circuit 16 (described in detail below). The determination circuit 16 has the function of supplying a control signal node1 in accordance with the reset signal por and the bias voltage (described in detail below).

The level shifter 14 converts, using the signal por_lv inputted from the POR 12 as an input signal, the potential of the input signal from the LV potential to the HV potential, and supplies an output signal out to the load circuit 15. The load circuit 15 is an electronic circuit inside the semiconductor device 10 and is not particularly limited.

The level shifter 14 according to the present exemplary embodiment controls the potential of an output node (see output node 87 in FIG. 2) in accordance with the control signal node1.

The LV regulator 20 is a regulator that operates at the LV potential. The LV regulator 20 generates and outputs the power supply voltage LV.

The other level shifter 22 is a level shifter provided separately from the level shifter 14. The configuration of the other level shifter 22 is the same as that of the level shifter 14.

Now, the semiconductor circuit 11 according to the present exemplary embodiment is described in detail. FIG. 2 illustrates a circuit diagram of an example of the semiconductor circuit 11 according to the present exemplary embodiment.

The semiconductor circuit 11 according to the present exemplary embodiment as described above includes the level shifter 14, the determination circuit 16 and the bias circuit 18.

Figure 2:
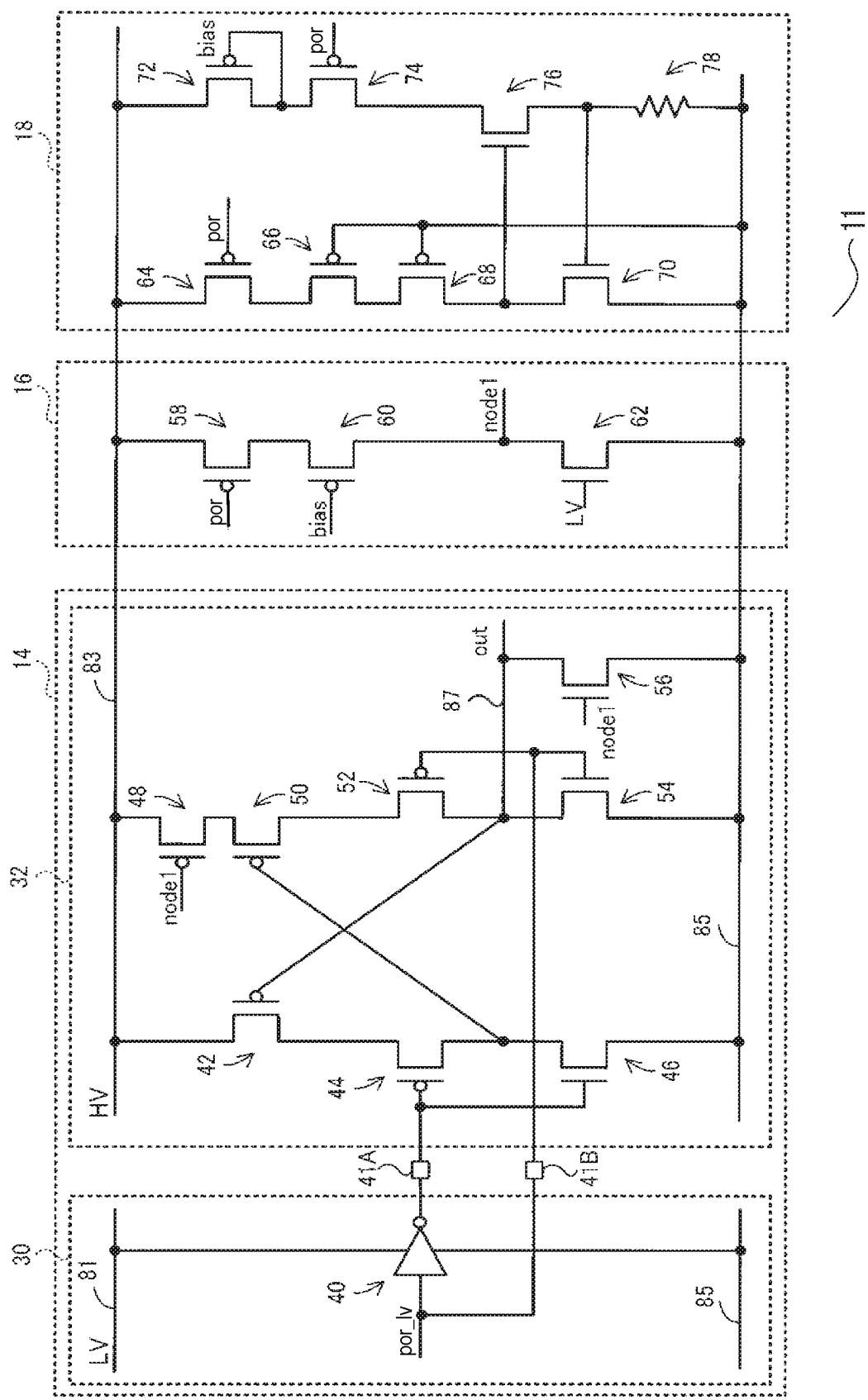
FIG. 2 is a circuit diagram illustrating a semiconductor circuit in accordance with the first exemplary embodiment.

As illustrated in FIG. 2, the level shifter 14 includes an LV circuit 30 and an HV circuit 32. The LV circuit 30 includes an inverting component 40. The signal por_lv from the POR 12 is inputted to the inverting component 40 as an input signal. The inverting component 40 is connected to the LV power supply line 81 and a power supply line 85, and is operated by the power supply voltage LV. A signal outputted from the inverting component 40 (an inverted signal of the signal por_lv) is supplied to the HV circuit 32 via an input terminal 41A. The signal por_lv inputted to the LV circuit 30 is also supplied to the HV circuit 32 via an input terminal 41B.

The HV circuit 32 includes PMOS transistors 42, 44, 48, 50 and 52 and NMOS transistors 46, 54 and 56. One of the main terminals of the PMOS transistor 42 (the source terminal) is connected to an HV power supply line 83. The control terminal of the PMOS transistor 42 is connected to the other main terminal (the drain terminal) of the PMOS transistor 52. One main terminal (the source terminal) of the PMOS transistor 44 is connected to the other main terminal (the drain terminal) of the PMOS transistor 42. The inverted signal of the signal por_lv from the LV circuit 30 is supplied via the input terminal 41A to the control terminal of the PMOS transistor 44. One main terminal (the drain terminal) of the NMOS transistor 46 is connected to the other main terminal (the drain terminal) of the PMOS transistor 44, and the other main terminal (the source terminal) of the NMOS transistor 46 is connected to the power supply line 85. The inverted signal of the signal por_lv from the LV circuit 30 is also supplied via the input terminal 41A to the control terminal of the NMOS transistor 46.

One main terminal (the source terminal) of the PMOS transistor 48 is connected to the HV power supply line 83. The control signal node1 is supplied to the control terminal of the PMOS transistor 48. One main terminal (the source terminal) of the PMOS transistor 50 is connected to the other main terminal (the drain terminal) of the PMOS transistor 48. The control terminal of the PMOS transistor 50 is connected to the other main terminal (the drain terminal) of the PMOS transistor 44. One main terminal (the source terminal) of the PMOS transistor 52 is connected to the other main terminal (the drain terminal) of the PMOS transistor 50. The signal por_lv from the LV circuit 30 is supplied via the input terminal 41B to the control terminal of the PMOS transistor 52. One main terminal (the drain terminal) of the NMOS transistor 54 is connected to the other main terminal (the drain terminal) of the PMOS transistor 52, and the other main terminal (the source terminal) of the NMOS transistor 54 is connected to the power supply line 85. The signal por_lv from the LV circuit 30 is also supplied via the input terminal 41B to the control terminal of the NMOS transistor 54.

The output node 87 is connected between the PMOS transistor 52 and the NMOS transistor 54. The output signal out whose potential has been converted to HV is outputted through the output node 87.

One main terminal (the drain terminal) of the NMOS transistor 56 is connected to the output node 87, and the other main terminal (the source terminal) of the NMOS transistor 56 is connected to the power supply line 85. The control signal node1 is supplied to the control terminal of the NMOS transistor 56.

The determination circuit 16 includes PMOS transistors 58 and 60 and an NMOS transistor 62. The PMOS transistors 58 and 60, and the NMOS transistor 62 are transistors with normal Vt.

One main terminal (the source terminal) of the PMOS transistor 58 is connected to the HV power supply line 83. The reset signal por is supplied to the control terminal of the PMOS transistor 58. One main terminal (the source terminal) of the PMOS transistor 60 is connected to the other main terminal (the drain terminal) of the PMOS transistor 58. The bias voltage is supplied to the control terminal of the PMOS transistor 60. One main terminal (the drain terminal) of the NMOS transistor 62 is connected to the other main terminal (the drain terminal) of the PMOS transistor 60, and the other main terminal (the source terminal) of the NMOS transistor 62 is connected to the power supply line 85. The power supply voltage LV is supplied to the control terminal of the NMOS transistor 62.

The potential between the PMOS transistor 60 and the NMOS transistor 62 is supplied from the determination circuit 16 to serve as the control signal node1.

The bias circuit 18 includes PMOS transistors 64, 66, 68, 72 and 74, NMOS transistors 70 and 76, and a resistance element 78. The PMOS transistors 64, 66, 68 and 72 and the NMOS transistors 70 and 76 are transistors with normal Vt.

A main terminal (the source terminal) of the PMOS transistor 64 is connected to the HV power supply line 83. The reset signal por is supplied to the control terminal of the PMOS transistor 64. One main terminal (the source terminal) of the PMOS transistor 66 is connected to the other main terminal (the drain terminal) of the PMOS transistor 64. The control terminal of the PMOS transistor 66 is connected to the power supply line 85. One main terminal (the source terminal) of the PMOS transistor 68 is connected to the other main terminal (the drain terminal) of the PMOS transistor 66. The control terminal of the PMOS transistor 68 is also connected to the power supply line 85. One main terminal (the drain terminal) of the NMOS transistor 70 is connected to the other main terminal (the drain terminal) of the PMOS transistor 68, and the other main terminal (the source terminal) of the NMOS transistor 70 is connected to the power supply line 85. The control terminal of the NMOS transistor 70 is connected to the other main terminal (the source terminal) of the NMOS transistor 76.

One main terminal (the source terminal) of the PMOS transistor 72 is connected to the HV power supply line 83. The control terminal of the PMOS transistor 72 is connected to the other main terminal (the drain terminal) of the same. A potential supplied to the control terminal of the PMOS transistor 72, that is, the potential of the other main terminal (the drain terminal) of the PMOS transistor 72, is supplied to serve as a bias voltage bias. One main terminal (the source terminal) of the PMOS transistor 74 is connected to the other main terminal (the drain terminal) of the PMOS transistor 72. The reset signal por is supplied to the control terminal of the PMOS transistor 74. One main terminal (the drain terminal) of the NMOS transistor 76 is connected to the other main terminal (the drain terminal) of the PMOS transistor 74, and the other main terminal (the source terminal) of the NMOS transistor 76 is connected to one end of the resistance element 78. The control terminal of the NMOS transistor 76 is connected to the other main terminal (the drain terminal) of the PMOS transistor 68. The other end of the resistance element 78 is connected to the power supply line 85.

Now, operation of the semiconductor circuit 11 according to the present exemplary embodiment is described.

When the power supply is turned ON or the like, the power supply voltage LV is at 0 V. When the LV circuit 30 has not started up, the LV circuit 30 is in the power-ON reset state and the reset signal por is at 0 V (the low level).

The bias circuit 18 according to the present exemplary embodiment is an automatic start-up circuit that is started up by the reset signal por. Accordingly, the bias circuit 18 starts up in response to the reset signal por at the low level, and when the power supply voltage HV rises, the bias voltage bias produced from the PMOS transistor 72 is supplied to the determination circuit 16.

In the determination circuit 16, the PMOS transistor 58 turns ON in response to the reset signal por at the low level, and the PMOS transistor 60 turns ON in response to the bias voltage bias. Meanwhile, the NMOS transistor 62 turns OFF in response to the power supply voltage LV at 0 V (the low level). Consequently, the potential of the control signal node1 is the high potential, that is, the HV potential (the high level).

In the HV circuit 32, the PMOS transistor 48 turns OFF in response to the control signal node1 at the high level. Meanwhile, the NMOS transistor 56 turns ON in response to the control signal node1 at the high level. Therefore, the potential of the output node 87 is fixed at the potential of the power supply line 85 (0 V in the present exemplary embodiment), and unstable states are avoided.

When the power supply voltage LV has some potential and the LV circuit 30 has begun start-up but the power-ON reset state still applies, the reset signal por is at 0 V (the low level).

The NMOS transistor 62 of the determination circuit 16 turns ON in response to the power supply voltage LV. Hence, the potential of the control signal node1 is at the potential of the power supply line 85 (in the present exemplary embodiment, 0 V, the low level).

In the HV circuit 32, the PMOS transistor 48 turns ON in response to the control signal node1 at the low level. Meanwhile, the NMOS transistor 56 turns OFF in response to the control signal node1 at the low level. Consequently, the fixing of the potential of the output node 87 is released, and the output signal out of the potential converted by the HV circuit 32 (the HV potential) can be outputted.

After start-up of the LV circuit 30, when the power-ON reset state is released, the reset signal por becomes high level.

The PMOS transistors 64 and 74 of the bias circuit 18 turn OFF in response to the reset signal por at the high level. The PMOS transistor 58 of the determination circuit 16 also turns OFF in response to the reset signal por at the high level. Therefore, leakage currents in the determination circuit 16 and the bias circuit 18 may be blocked.

Figure 3:
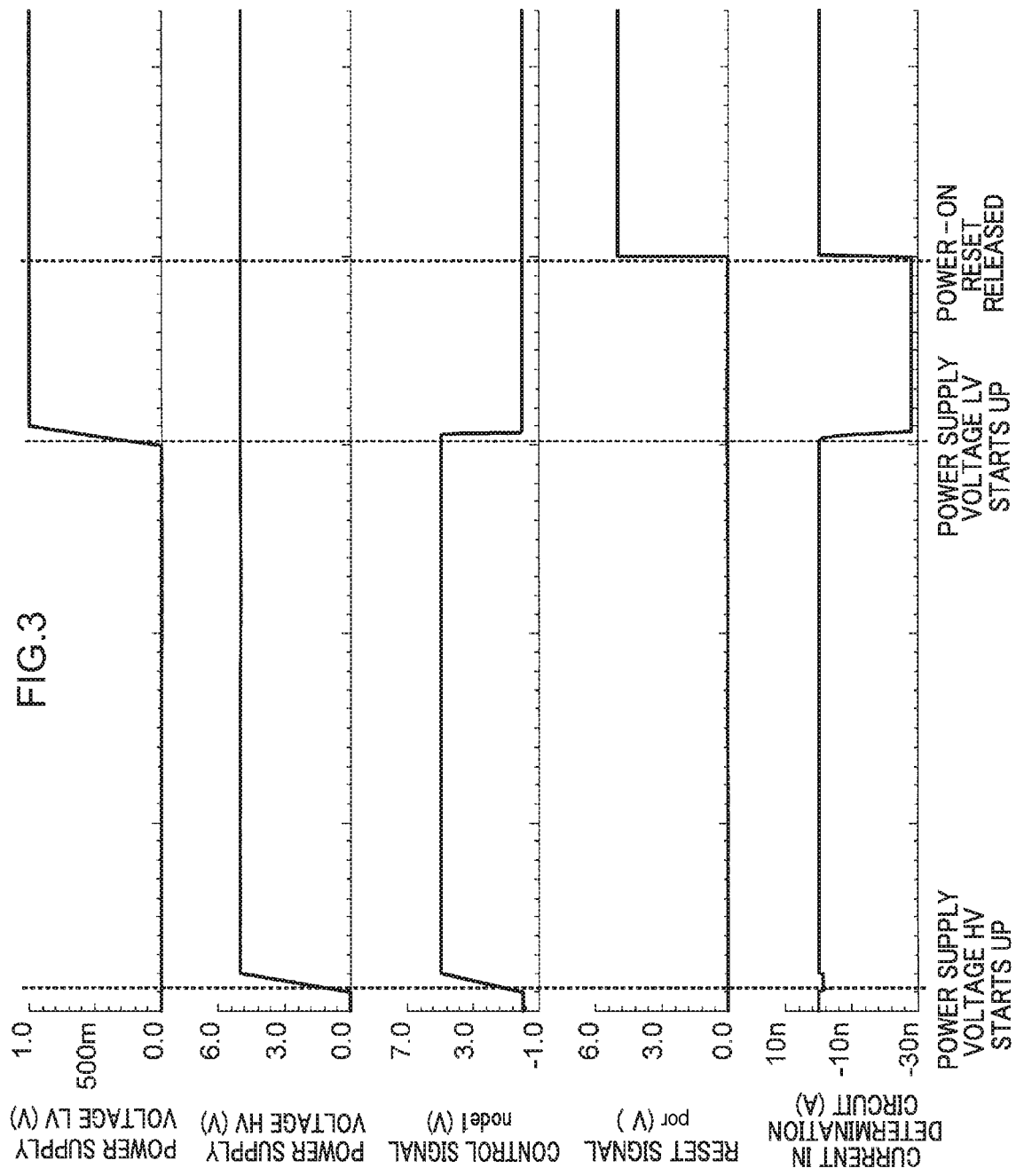
FIG. 3 is a diagram illustrating an example of operation waveforms suitable for description of the semiconductor circuit in accordance with the first exemplary embodiment.
Figure 4:
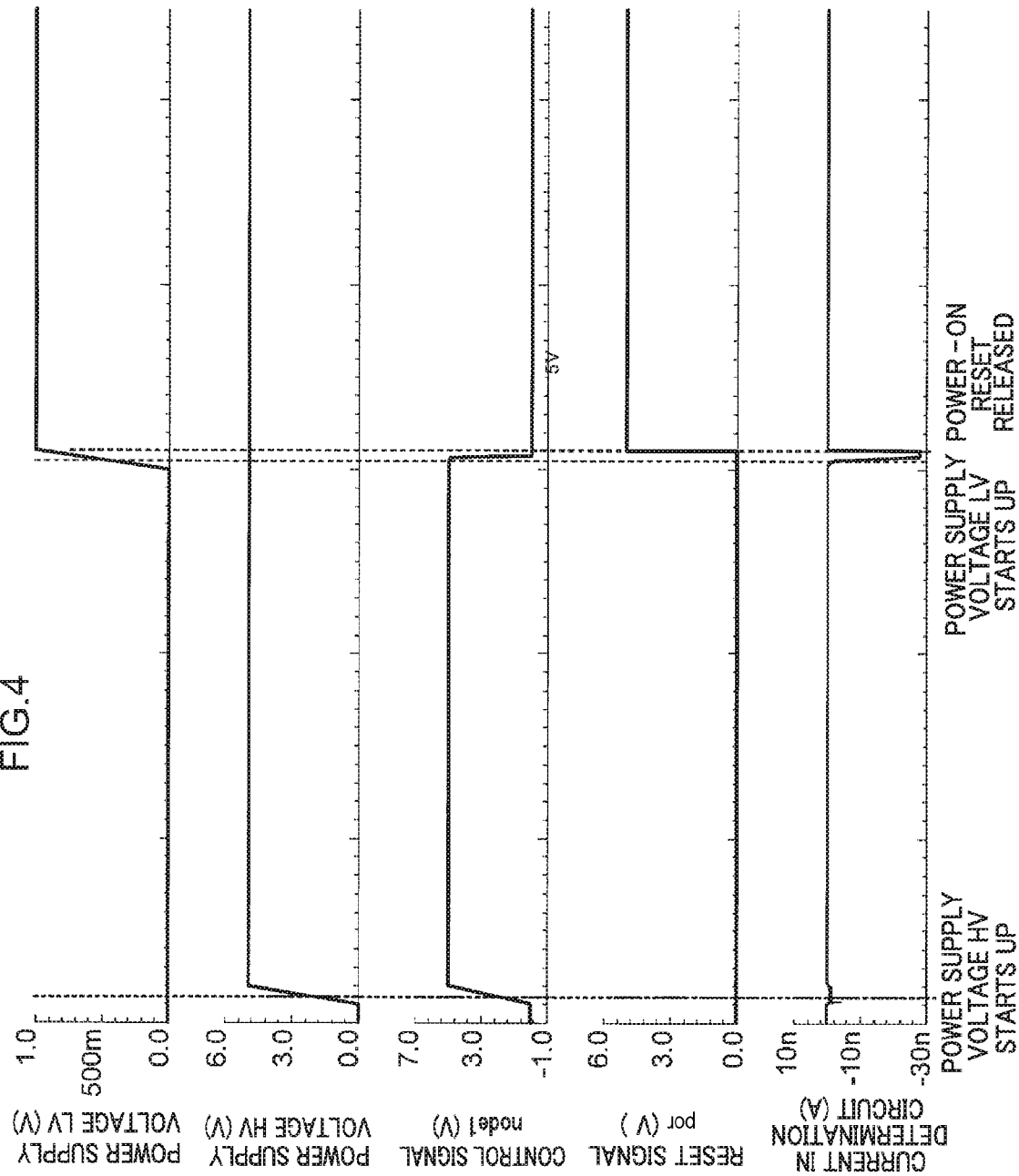
FIG. 4 is a diagram illustrating an example of actual operation waveforms of the semiconductor circuit in accordance with the first exemplary embodiment.

FIG. 3 and FIG. 4 illustrate examples of operation waveforms of the semiconductor circuit 11. FIG. 3 and FIG. 4 illustrate waveforms of the power supply voltage LV, the power supply voltage HV, the control signal node1, the reset signal por (the signal por_lv) and current consumption in the determination circuit 16.

FIG. 3 illustrates operation waveforms suitable for description, illustrated with operation timings that aid understanding, and FIG. 4 illustrates actual operation waveforms. In FIG. 3, a case in which the power-ON reset state is released some time after the start-up of the power supply voltage LV is illustrated. In practice, as illustrated in FIG. 4, the start-up of the power supply voltage LV and the release of the power-ON reset state are at almost simultaneous timings.

As illustrated in FIG. 3, while the power supply voltage LV has not yet started up, the control signal node1 is at the power supply voltage HV (in the present exemplary embodiment, 5 V). Then, after start-up of the power supply voltage LV, the control signal node1 becomes 0 V.

The current consumption in the determination circuit 16 becomes 0 A after the release of the power-ON reset state.

Second Exemplary Embodiment

The overall configuration of the semiconductor device 10 according to the present exemplary embodiment is the same as the configuration of the semiconductor device 10 according to the first exemplary embodiment (FIG. 1). Therefore, no description is given of the overall configuration of the semiconductor device 10. In the present exemplary embodiment, the semiconductor circuit 11 differs from the semiconductor circuit 11 according to the first exemplary embodiment. Therefore, the configuration of the semiconductor circuit 11 according to the present exemplary embodiment is described.

Figure 5:
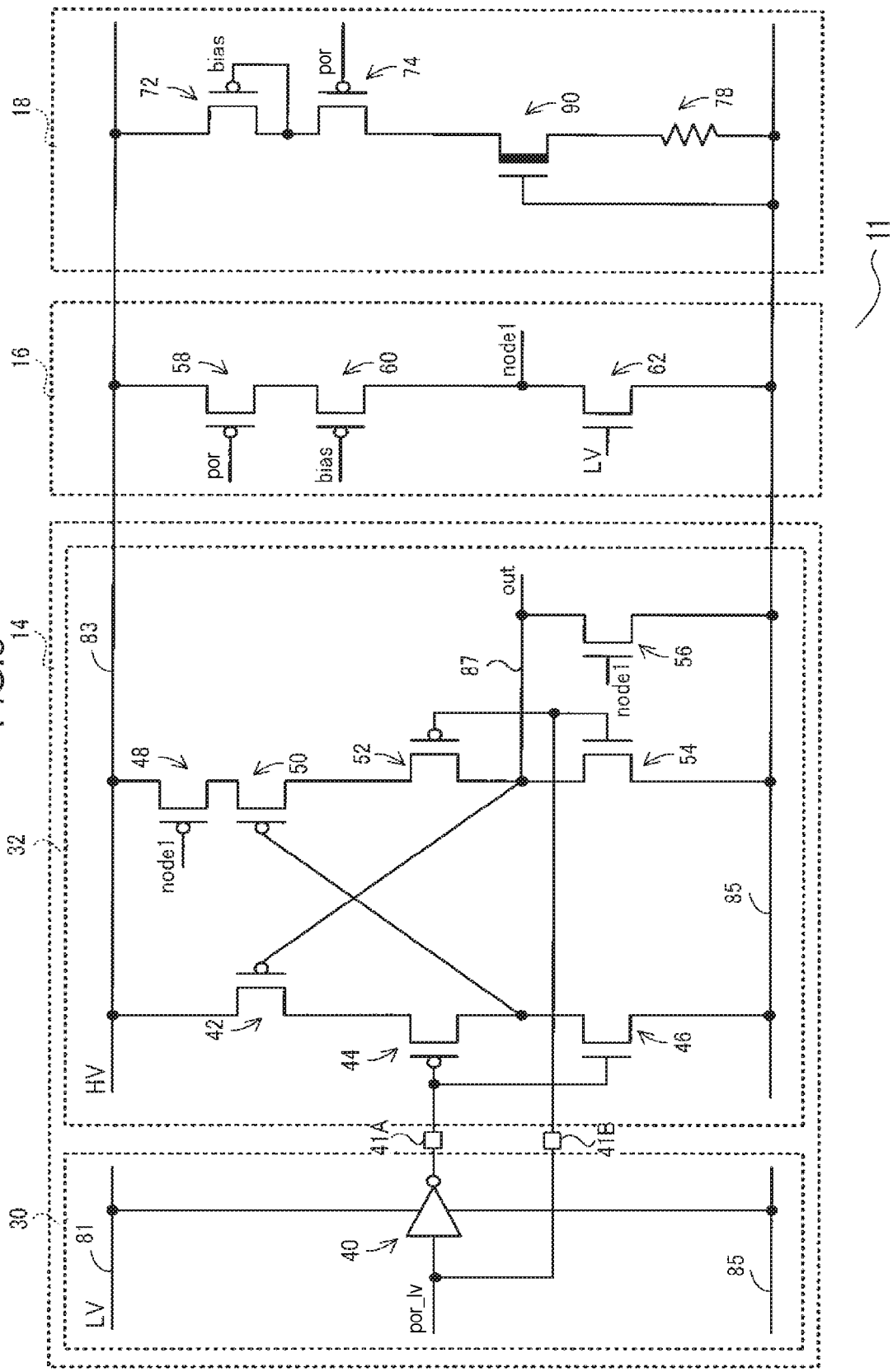
FIG. 5 is a circuit diagram illustrating a semiconductor circuit in accordance with a second exemplary embodiment.

FIG. 5 illustrates a circuit diagram of an example of the semiconductor circuit 11 according to the present exemplary embodiment.

In the semiconductor circuit 11 illustrated in FIG. 5, the bias circuit 18 differs from that in the semiconductor circuit 11 according to the first exemplary embodiment. The bias circuit 18 according to the present exemplary embodiment includes the PMOS transistors 72 and 74 and a DMOS transistor 90.

The one main terminal (the source terminal) of the PMOS transistor 72 is connected to the HV power supply line 83. The control terminal of the PMOS transistor 72 is connected to the other main terminal (the drain terminal) of the same. A potential supplied to the control terminal of the PMOS transistor 72, that is, the potential of the other main terminal (the drain terminal) of the PMOS transistor 72, is supplied to serve as the bias voltage bias. The one main terminal (the source terminal) of the PMOS transistor 74 is connected to the other main terminal (the drain terminal) of the PMOS transistor 72. The reset signal por is supplied to the control terminal of the PMOS transistor 74.

One main terminal of the DMOS transistor 90 is connected to the other main terminal (the drain terminal) of the PMOS transistor 74, and the other main terminal of the DMOS transistor 90 is connected to one end of the resistance element 78. The control terminal of the DMOS transistor 90 is connected to the power supply line 85. The other end of the resistance element 78 is connected to the power supply line 85.

According to this configuration, the bias circuit 18 according to the present exemplary embodiment may be an automatic start-up circuit that does not require a separate start-up signal but is started up by the reset signal por, similarly to the bias circuit 18 according to the first exemplary embodiment. Therefore, the bias circuit 18 may supply the bias voltage bias in response to the start-up of the power supply voltage HV.

Thus, the semiconductor circuit 11 according to the present exemplary embodiment operates similarly to the semiconductor circuit 11 according to the first exemplary embodiment (see FIG. 3 and FIG. 4).

Third Exemplary Embodiment

For the semiconductor circuit 11 according to each of the exemplary embodiments described above, a case in which the bias circuit 18 is provided is described. However, even if the bias circuit 18 is not provided, the output of the level shifter 14 may be prevented from entering unstable states and leakage currents may be blocked.

Figure 6:
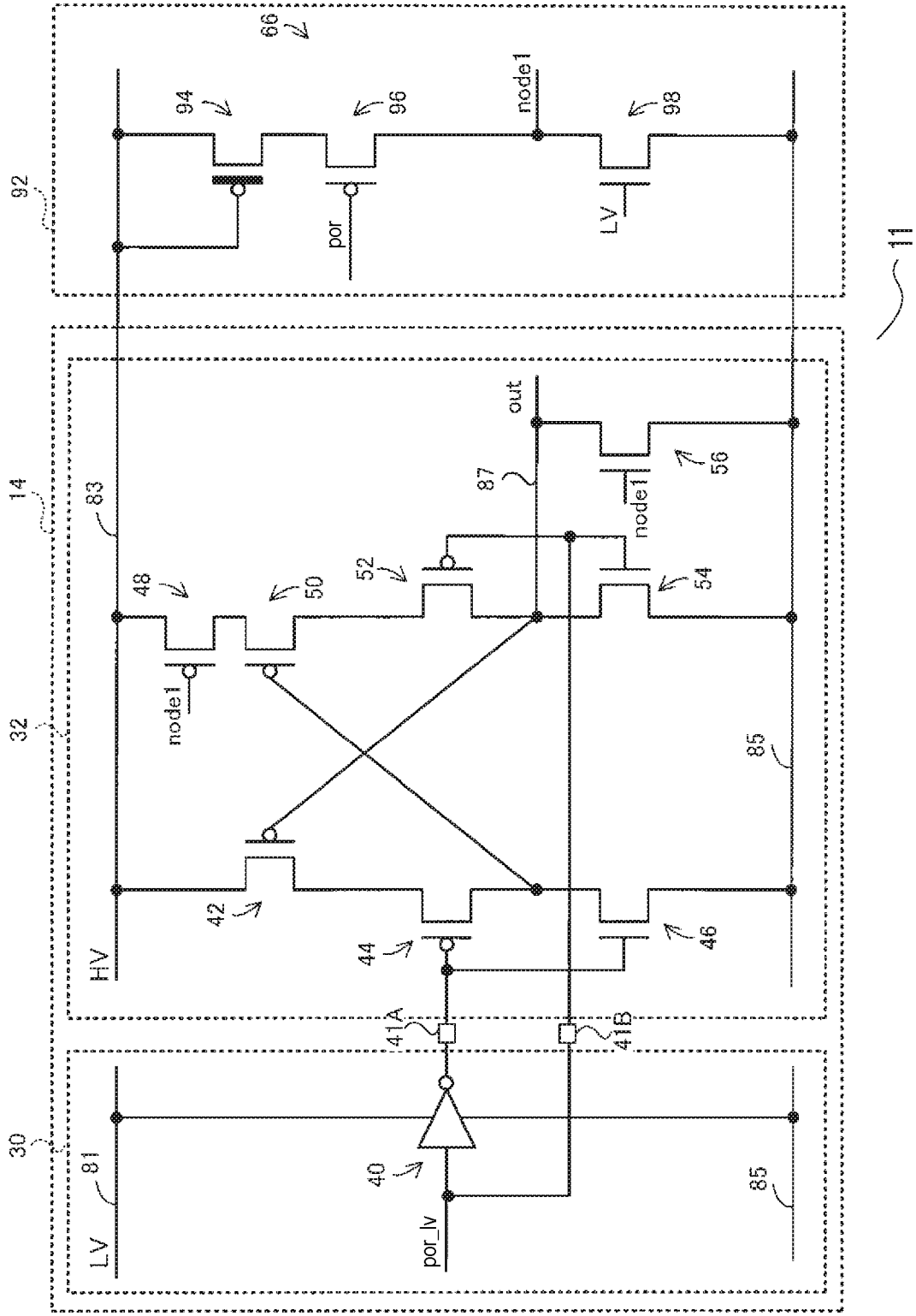
FIG. 6 is a circuit diagram illustrating a semiconductor circuit in accordance with a third exemplary embodiment.

FIG. 6 illustrates a circuit diagram of an example of the semiconductor circuit 11 according to the present exemplary embodiment. The semiconductor circuit 11 includes a determination circuit 92 in place of the determination circuit 16 and bias circuit 18 of the exemplary embodiments described above. Other configurations are the same as in the exemplary embodiments described above.

The determination circuit 92 includes a PMOS transistor 94 with low Vt, a PMOS transistor 96 with normal Vt and an NMOS transistor 98 with normal Vt.

One main terminal (the source terminal) of the PMOS transistor 94 is connected to the HV power supply line 83. The control terminal of the PMOS transistor 94 is also connected to the HV power supply line 83. One main terminal (the source terminal) of the PMOS transistor 96 is connected to the other main terminal (the drain terminal) of the PMOS transistor 94. The reset signal por is supplied to the control terminal of the PMOS transistor 96.

One main terminal (the source terminal) of the NMOS transistor 98 is connected to the other main terminal (the drain terminal) of the PMOS transistor 96, and the other main terminal (the source terminal) of the NMOS transistor 98 is connected to the power supply line 85. The power supply voltage LV is supplied to the control terminal of the NMOS transistor 98.

The potential between the PMOS transistor 96 and the NMOS transistor 98 is supplied from the determination circuit 92 to serve as the control signal node1.

Now, operation of the semiconductor circuit 11 according to the present exemplary embodiment is described.

When the power supply is turned ON or the like, the power supply voltage LV is at 0 V. When the LV circuit 30 has not started up, the LV circuit 30 is in the power-ON reset state and the reset signal por is at 0 V (the low level).

Because the PMOS transistor 94 has a low Vt and the control terminal is connected to the source terminal, the PMOS transistor 94 is ordinarily turned OFF but has a larger leakage current (from hundreds of pA to tens of nA) than a transistor with a normal Vt (the PMOS transistor 96). The NMOS transistor 98 turns OFF in response to the power supply voltage LV at the low level.

Consequently, the potential of the control signal node1 is at a high potential, that is, the HV potential (the high level).

In the HV circuit 32, the PMOS transistor 48 turns OFF in response to the control signal node1 at the high level. Meanwhile, the NMOS transistor 56 turns ON in response to the control signal node1 at the high level. Therefore, the potential of the output node 87 is fixed at the potential of the power supply line 85 (0 V in the present exemplary embodiment), and unstable states are avoided.

When the power supply voltage LV has some potential and the LV circuit 30 has begun start-up but the power-ON reset state still applies, the reset signal por is at 0 V (the low level).

The NMOS transistor 98 of the determination circuit 92 turns ON in response to the power supply voltage LV. Hence, the potential of the control signal node1 is at the potential of the power supply line 85 (in the present exemplary embodiment, 0 V, the low level). At this time, a leakage current flows in the PMOS transistor 94.

In the HV circuit 32, the PMOS transistor 48 turns ON in response to the control signal node1 at the low level. Meanwhile, the NMOS transistor 56 turns OFF in response to the control signal node1 at the low level. Consequently, the fixing of the potential of the output node 87 is released, and the output signal out of the potential converted by the HV circuit 32 (the HV potential) may be outputted.

After start-up of the LV circuit 30, when the power-ON reset state is released, the reset signal por goes to the high level.

The PMOS transistor 96 of the determination circuit 92 turns OFF in response to the reset signal por at the high level. Therefore, leakage currents in the determination circuit 92 (the PMOS transistor 94) may be blocked.

That is, the determination circuit 92 according to the present exemplary embodiment is started up by the leakage current in the PMOS transistor 94. Then, after the power supply voltage LV starts up and the LV circuit 30 is started up, the leakage current is blocked.

As described hereabove, the semiconductor circuit 11 provided in the semiconductor device 10 according to the first and second exemplary embodiments includes the level shifter 14, the determination circuit 16 and the bias circuit 18. The bias circuit 18 automatically starts up in response to the reset signal por and supplies the bias voltage bias. The determination circuit 16 includes the PMOS transistors 58 and 60 connected in series. The PMOS transistor 58 turns ON and OFF in accordance with the reset signal por, and the PMOS transistor 60 turns ON and OFF in accordance with the bias voltage bias. The determination circuit 16 is also provided with the NMOS transistor 62 connected in series with the PMOS transistor 60. The NMOS transistor 62 turns ON and OFF in accordance with the power supply voltage LV. The potential between the PMOS transistor 60 and the NMOS transistor 62 is supplied to the HV circuit 32 of the level shifter 14 as the control signal node1. The control signal node1 is supplied to the control terminals of the PMOS transistor 48 and NMOS transistor 56 of the HV circuit 32, controlling the PMOS transistor 48 and NMOS transistor 56 to turn ON and OFF in accordance with the control signal node1.

In general, in the level shifter 14, the start-up of the power supply voltage LV that is used in the LV circuit 30 is later than the start-up of the power supply voltage HV that is used in the HV circuit 32. Thus, there is a state in which the power supply voltage of the HV circuit 32 has some potential but the power supply voltage LV in the LV circuit 30 has no potential (0 V) or is extremely low. Therefore, the potentials of the input terminals 41A and 41B are both at 0 V or a very low potential. Usually, it is required that a signal at one (the high level) be inputted at one of the input terminals 41A and 41B of the level shifter 14 and a signal at zero (the low level) be inputted at the other. When both are at zero (the low level), the output signal out of the level shifter 14 is unstable. Similarly, if both of the input terminals 41A and 41B of the level shifter 14 are at one (the high level), the output signal out of the level shifter 14 is unstable.

Figure 7:
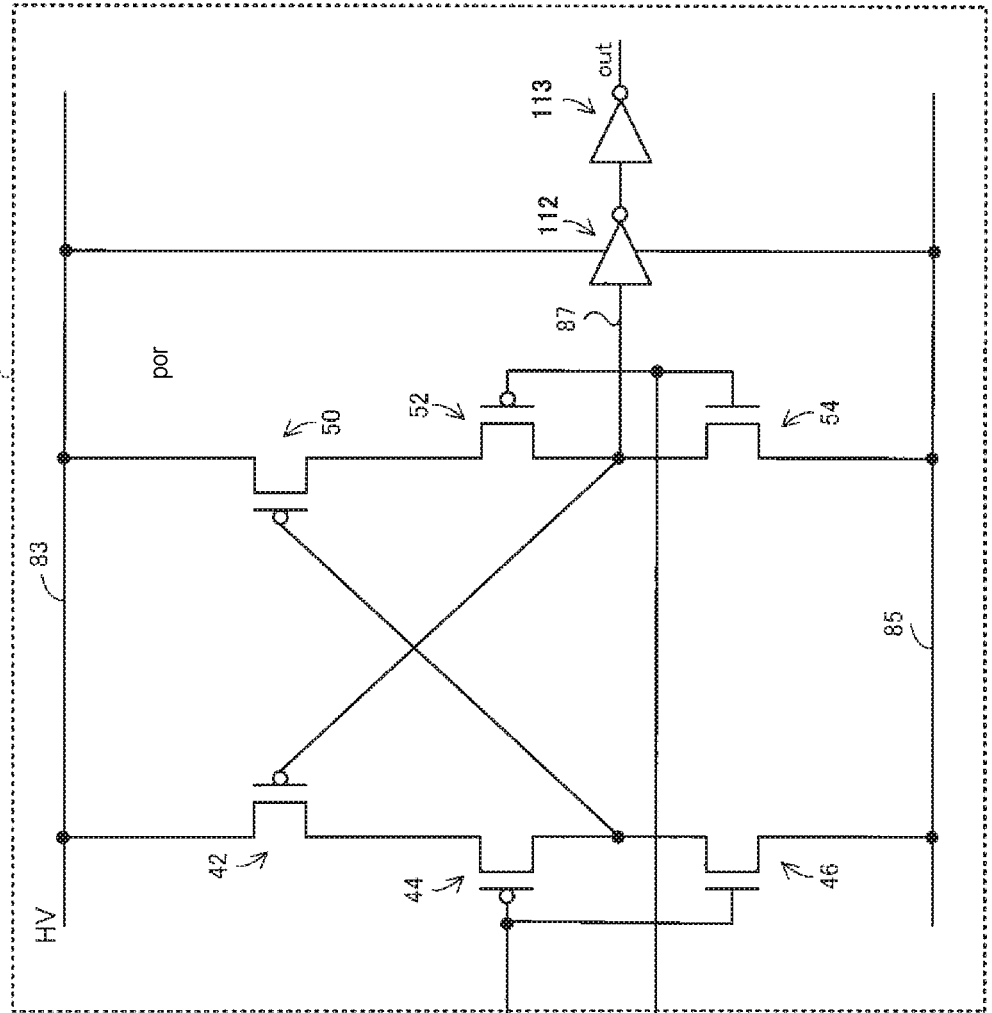
FIG. 7 is a circuit diagram illustrating an example of a conventional semiconductor circuit.

As a comparative example, FIG. 7 illustrates a circuit diagram of an example of a conventional semiconductor circuit 111. The conventional semiconductor circuit 111 differs from the first and second exemplary embodiments described above in that circuits corresponding to the determination circuit 16 and the bias circuit 18 are not provided; the semiconductor circuit 111 is just a level shifter 114. An HV circuit 132 of the conventional level shifter 114 differs from the first and second exemplary embodiments described above in that the PMOS transistor 48 and the NMOS transistor 56 are not provided. In the conventional level shifter 114, inverting components 112 and 113 are provided. An output signal out is outputted via the output node 87 and the inverting components 112 and 113.

In the semiconductor circuit 111 according to the comparative example (the level shifter 114), if the start-up of the power supply voltage LV that is used in the LV circuit 30 is later than the start-up of the power supply voltage HV that is used in the HV circuit 132 as described above, both of the input terminals 41A and 41B are at zero (the low level), and the output signal out of the level shifter 114 becomes unstable.

In the semiconductor circuit 11 according to the first and second exemplary embodiments described above, at the time the power supply is turned ON or the like, when the power supply voltage LV is at 0 V and the LV circuit 30 has not started up but the power-ON reset state applies and the reset signal por is at 0 V (the low level), the potential of the control signal node1 supplied from the determination circuit 16 is at the high potential, that is, the HV potential (the high level). In the HV circuit 32, the potential of the output node 87 is fixed at the potential of the power supply line 85 (0 V in the present exemplary embodiments) in accordance with the control signal node1. Thus, unstable states are avoided.

When the power supply voltage LV has some potential and the LV circuit 30 has begun start-up but the reset signal por is still at 0 V (the low level), the potential of the control signal node1 outputted from the determination circuit 16 is at the potential of the power supply line 85 (0 V in the present exemplary embodiment, the low level). In the HV circuit 32, the fixing of the potential of the output node 87 is released in response to the control signal node1. Hence, the output signal out of the potential converted by the HV circuit 32 (the HV potential) may be outputted.

When the power-ON reset state is released after the start-up of the LV circuit 30, the reset signal por goes to the high level, and the PMOS transistors 64 and 74 of the bias circuit 18 and the PMOS transistor 58 of the determination circuit 16 turn OFF. Therefore, leakage currents in the determination circuit 16 and the bias circuit 18 may be blocked.

Thus, in the semiconductor circuit 11 according to the first and second exemplary embodiments described above, the output of the level shifter may be prevented from entering unstable states, in addition to which leakage currents may be blocked.

In the semiconductor circuit 11 according to the third exemplary embodiment, similarly to the semiconductor circuit 11 according to the first and second exemplary embodiments described above, the output of the level shifter may be prevented from entering unstable states, in addition to which leakage currents may be blocked.

In the semiconductor circuit 11 according to the first and second exemplary embodiments described above, all of the PMOS transistors and NMOS transistors of the determination circuit 16 and bias circuit 18 have normal Vt. Therefore, fabrication processes may be kept simple.

In the semiconductor circuit 11 according to the first and second exemplary embodiments described above, even if there is a fall in the potential of the power supply voltage LV such that the potential levels of the input terminals 41A and 41B become equal, the POR 12 senses the fall in the potential and the determination circuit 16 and bias circuit 18 operate automatically. Therefore, in the semiconductor circuit 11 according to the first and second exemplary embodiments described above, the output of the level shifter may be suitably prevented from entering an unstable state.

In the semiconductor circuit 11 according to the exemplary embodiments described above, because the power supply voltage HV is used in the HV circuit 32, through-current may be suppressed compared to a case in which the power supply voltage LV is used.

In the semiconductor circuit 11 according to the exemplary embodiments described above, because the semiconductor circuit 11 operates in response to the reset signal por, effects caused by malfunctions at times of start-up of the LV circuit 30 may be suppressed.

In the semiconductor circuit 11 according to the exemplary embodiments described above, both the PMOS transistor 48 and NMOS transistor 56 of the level shifter 14 are controlled by the control signal node1, and the potentials thereof are fixed. Therefore, the potentials may be fixed regardless of the output of the HV circuit 32 and through-current may be suppressed.

In the semiconductor circuit 11 according to the exemplary embodiments described above, it is sufficient for one of the determination circuit 16 to be provided for one of the LV circuit 30. Therefore, circuit area and current consumption may be suppressed.

It is not preferable for the reset signal por to be supplied directly to the level shifter 14. However, in the semiconductor circuit 11 according to the exemplary embodiments described above, the control signal node1 is supplied instead of the reset signal por; this is preferable.

The bias circuit 18 may share a bias current source with other circuits such as the LV regulator 20 and the like.

The power supply voltage LV is supplied to the control terminal of the NMOS transistor 62 of the determination circuit 16 of the semiconductor circuit 11 according to the first and second exemplary embodiments described above or to the NMOS transistor 98 of the determination circuit 16 of the semiconductor circuit 11 according to the third exemplary embodiment, but this is not limiting. The power supply voltage LV itself need not be supplied. For example, a divided voltage of the power supply voltage LV or a bias voltage generated in the LV circuit 30 may be supplied. When a voltage with a potential lower than the power supply voltage LV is supplied, the timing at which the NMOS transistor 62 or 98 is switched to the ON state may be delayed. Thus, it is possible to wait until the LV regulator 20 is thoroughly started up.

In other respects, configurations and operations of the semiconductor device 10, semiconductor circuit 11 and the like described in the above exemplary embodiments are examples and may be modified in accordance with conditions within a scope that does not deviate from the spirit of the present invention.

What is claimed is:

1. A semiconductor circuit comprising:
   a level shifter circuit that, in accordance with supply of a power supply voltage, converts a potential of an input signal from a first potential to a second potential that is higher than the first potential and outputs the second potential through an output node;
   a potential supply circuit, to which a reset signal at a level in accordance with the power supply voltage is supplied, that supplies a predetermined potential in accordance with the level of the reset signal; and
   a control circuit that controls the potential of the output node of the level shifter circuit in accordance with a level of the predetermined potential supplied from the potential supply circuit.

2. The semiconductor circuit according to claim 1, wherein the reset signal is supplied to the control circuit, and the control circuit controls the potential of the output node of the level shifter circuit in accordance with the level of the reset signal and the level of the predetermined potential.

3. The semiconductor circuit according to claim 2, wherein the control circuit comprises:
   a first PMOS transistor including one main terminal connected to a first power supply line that supplies a power supply voltage at the second potential, and a control terminal to which the reset signal is supplied;
   a second PMOS transistor including one main terminal connected to an other main terminal of the first PMOS transistor, and a control terminal to which the predetermined potential is supplied; and
   an NMOS transistor including one main terminal connected to the second PMOS transistor, an other main terminal connected to a second power supply line that supplies a power supply voltage lower than the first potential, and a control terminal to which the first potential is supplied, and
   wherein the control circuit controls the potential of the output node of the level shifter circuit by the potential of a node between the second PMOS transistor and the NMOS transistor.

4. The semiconductor circuit according to claim 1, wherein the level shifter circuit comprises:
   a first circuit section to which the input signal is inputted and that operates on the basis of a power supply voltage at the first potential; and
   a second circuit section that operates on the basis of a power supply voltage at the second potential, converts the potential of the input signal supplied from the first circuit section to the second potential and outputs the second potential through the output node.

5. The semiconductor circuit according to claim 4, wherein the potential supply circuit and the control circuit are connected to the second circuit section and operate on the basis of the power supply voltage at the second potential.

6. The semiconductor circuit according to claim 3, wherein the potential supply circuit comprises:
   a third PMOS transistor including one main terminal connected to the first power supply line that supplies the power supply voltage at the second potential, and a control terminal connected to an other main terminal of the third MOS transistor;
   a fourth PMOS transistor including one main terminal connected to the other main terminal of the third PMOS transistor, and a control terminal to which the reset signal is supplied; and
   a DMOS transistor including one main terminal connected to an other main terminal of the fourth PMOS transistor, and an other main terminal and a control terminal connected to the second power supply line that supplies a third potential that is lower than the first potential and the second potential.

7. The semiconductor circuit according to claim 1, wherein the reset signal is supplied to the potential supply circuit at a level in accordance with a power supply voltage at the first potential.

8. A semiconductor device comprising:
   a semiconductor circuit according to claim 1;
   a load circuit to which the output signal outputted through the output node of the level shifter circuit of the semiconductor circuit is supplied; and
   a power-ON reset circuit that supplies the reset signal in accordance with the power supply voltage.

9. A potential supply circuit to which a reset signal at a level in accordance with a power supply voltage of a level shifter circuit is supplied, the potential supply circuit supplying a predetermined potential on the basis of the reset signal, wherein
   the power supply voltage is a power supply voltage that is supplied to the level shifter circuit, the level shifter circuit converting a potential of an input signal from a first potential to a second potential that is higher than the first potential and outputting the second potential through an output node, and
   the potential supply circuit supplies the predetermined potential to a control circuit that controls the potential of the output node of the level shifter circuit.

* * * * *